United States Patent [19]
Palmer

[11] Patent Number: 5,930,116
[45] Date of Patent: Jul. 27, 1999

[54] INTEGRATED CLAMPING MECHANISM

[75] Inventor: Daniel A. Palmer, Simi Valley, Calif.

[73] Assignee: Harman International Industries, Incorporated, Northridge, Calif.

[21] Appl. No.: 09/097,242

[22] Filed: Jun. 12, 1998

[51] Int. Cl.[6] .................................................. H05K 7/20
[52] U.S. Cl. .......................... 361/704; 361/707; 361/710; 361/712; 361/714; 174/16.3; 257/718; 257/719; 257/726; 165/80.3; 165/185
[58] Field of Search .................................. 361/704, 707, 361/713, 714, 719; 257/707, 709, 718, 719, 727; 174/52.1, 16.3; 165/80.3, 185

[56] References Cited

U.S. PATENT DOCUMENTS

| | | | |
|---|---|---|---|
| 4,481,525 | 11/1984 | Calabro et al. | 357/81 |
| 4,509,839 | 4/1985 | Lavochkin | 357/81 |
| 5,109,318 | 4/1992 | Funari et al. | 361/388 |
| 5,138,524 | 8/1992 | Smithers | 361/386 |
| 5,161,087 | 11/1992 | Frankeny et al. | 361/702 |
| 5,225,965 | 7/1993 | Bailey et al. | 361/704 |
| 5,276,585 | 1/1994 | Smithers | 361/704 |
| 5,321,582 | 6/1994 | Casperson | 361/713 |
| 5,397,856 | 3/1995 | Lee | 174/52.1 |
| 5,402,313 | 3/1995 | Casperson et al. | 361/710 |
| 5,475,564 | 12/1995 | Chiou | 361/704 |
| 5,548,482 | 8/1996 | Hatauchi et al. | 361/720 |
| 5,594,624 | 1/1997 | Clemens et al. | 361/704 |
| 5,638,258 | 6/1997 | Lin | 361/704 |
| 5,671,118 | 9/1997 | Blomquist | 261/704 |

*Primary Examiner*—Leo P. Picard
*Assistant Examiner*—Boris L. Chervinsky
*Attorney, Agent, or Firm*—Jones, Day, Reavis & Pogue

[57] ABSTRACT

A heat sink for heat-generating electronic packages wherein the multiple heat-generating circuit packages are mounted on at least one surface of a heat sink and wherein the covers for the heat sink have protrusions thereon which, when the covers are in the closed position, engage the heat-generating circuit packages and hold them in heat transfer relationship with the heat sink.

10 Claims, 3 Drawing Sheets

INTEGRATED CLAMPING MECHANISM

BACKGROUND OF THE INVENTION

1. Field of the Invention

The present invention relates in general to heat sinks and in particular to a clamping mechanism that is integrated with the heat sink. One of the heat sink covers is used as the clamping mechanism for holding multiple semiconductor heat-generating devices in heat transfer relationship with the heat sink.

2. Description of Related Art Including Information Disclosed Under 37 CFR 1.97 and 1.98

It is well known in modern electronics and integrated circuits that certain electronic devices are power devices that generate substantial amounts of heat that would otherwise harm the device or the integrated circuit and which heat must be dissipated in some well-known manner. There are different types of devices for dissipating heat including heat sinks attached directly to the heat-generating electronic device. In other versions, a metal clamp or bracket with a screw through it is used to hold down one or more semiconductor devices to a heat sink device thus transferring heat from a semiconductor device to the heat sink under normal operating conditions and keeping the device operating within the safe operating temperature of the device.

In order to use this traditional method, the clamp must be fabricated and has associated tooling costs. Of course, one or more of the clamps is required to be mounted on the heat sink during the construction of the electronic circuit. Further, screws are generally used to hold the clamps on the heat-generating devices. This requires holes to be drilled in the heat sink as a secondary operation incurring additional costs. Finally, during production, the screws and clamps are installed and properly torqued to a specified torque specification by a production line worker. Incorrect torque settings can cause poor heat sink qualities and can cause device failure if the torque is too low, or can crack the device package and cause device failure if the torque is too high.

It became obvious that if the parts and labor were to be reduced in products such as car amplifier designs, and thus reduce costs, then a more cost-efficient heat sink design has to be utilized. Further, any such heat-transferring mechanism required consistent pressure on the multiple semiconductor devices to eliminate any possibility of torque variation, and thus heat transfer variation, during operation of the device.

SUMMARY OF THE INVENTION

The present invention utilizes the bottom covers of the heat sink as a clamping mechanism to hold multiple semiconductor devices in heat transfer relationship with the heat sink. This is done by the use of stamped or extruded bottom covers which function as the primary clamps. The heat sink extrusion is designed with notches or slots, depending on the type of bottom cover used, functioning as the fulcrum of a lever arm. The bottom covers are designed to function as lever arms in conjunction with these fulcrums. The heat-generating devices are located close to the fulcrum for maximum downward pressure and when the lever arm or bottom cover is pulled down to its closed position, the semiconductor devices are effectively and automatically clamped to the heat sink.

This design has many advantages. First, the cost of the heat sink is significantly lowered due to the elimination of secondary operations facilitated by this design. Thus, no screw holes are required to be drilled into the heat sink in order to secure one or more of the semiconductive devices as is the case in the prior art. Further, the fulcrum or pivot point of the lever arm and other important features of the heat sink are integrated into the heat sink as part of the extruded or cast part. Thus, no real additional costs are incurred since the heat sink structures come directly off the extrusion machine or from the cast process with the required features in place. Therefore, there are no metal clamps or brackets required. No clamp screws are required. No bottom cover screws are required as the bottom cover is held in place by end panel screws that not only secure the end panel but also the bottom cover. In addition, no labor is required for installation of screws, washers, clamps, or brackets nor is there a need for torque specifications in production since none of these items is used. Further, there are no burrs on the heat sink spreader or dissipation area, caused by drilling holes, which often causes short-circuiting of the semiconductive devices, a common problem also caused by thread-forming screws.

Further, since there are inherent differences in the package thickness of the semiconductor heat-generating devices, it becomes necessary to have a spring mechanism of some sort to compensate for the thickness of the semiconductive devices. To do this, some resilient material such as silicone foam, Poron foam, spring steel, or any other resilient material that is suitably rated for the operating temperatures of the semiconductor devices is used and is located between the devices and the clamping surface integrated into the bottom cover. The compression force of the foam or other material at any given deflection and the material's ability to resist taking or holding a set after long durations of compression are important to this design application in order to maintain proper clamping pressure. After the bottom covers are seated properly, a standard thread-forming screw is commonly used to secure the end panels which also hold the bottom covers firmly and securely in place.

Thus, it is an object of the present invention to provide a clamping mechanism for the heat sinking of multiple electronic heat-generating devices such as semiconductors.

It is still another object of the present invention to use the bottom cover of a heat sink as the clamping mechanism.

It is yet another object of the present invention to provide a heat sink extrusion designed with notches or slots that function as the fulcrum of a lever arm with the bottom covers designed to be the lever arms that provide the clamping of the heat-generating electronic devices.

It is also an object of the present invention to provide a clamping mechanism for the heat sinking of multiple electronic heat-generating devices with significantly lower costs because no separate metal clamps or brackets are required, no screw holes have to be drilled, no clamp screws are required, and no labor is required for the installation of screws, washers, clamps, and brackets, nor is there a need for torque specifications in production of the product requiring the heat sinks.

Thus, the present invention relates to a heat sink for heat-generating electronic circuit packages comprising a heat sink body portion for dissipating heat, at least one surface on the heat sink body portion for receiving multiple heat-generating electronic circuit packages in heat transfer relationship, at least one panel pivotally attached to the heat sink body portion for movement between closed and open positions, electronic circuit package engaging means placed between the panel and the heat-generating electronic circuit packages for forcing the multiple heat-generating circuit packages against the heat sink surface in the heat transfer relationship only when the panel is in the closed position, and fastening means associated with the heat sink and the panel for releasably holding the panel in the closed position.

BRIEF DESCRIPTION OF THE DRAWINGS

These and other features of the present invention will be more fully disclosed when taken in conjunction with the following Detailed Description of the Preferred Embodiment(s) in which like numerals represent like elements and in which.

DETAILED DESCRIPTION OF THE PREFERRED EMBODIMENT(S)

Figures 1, 2:
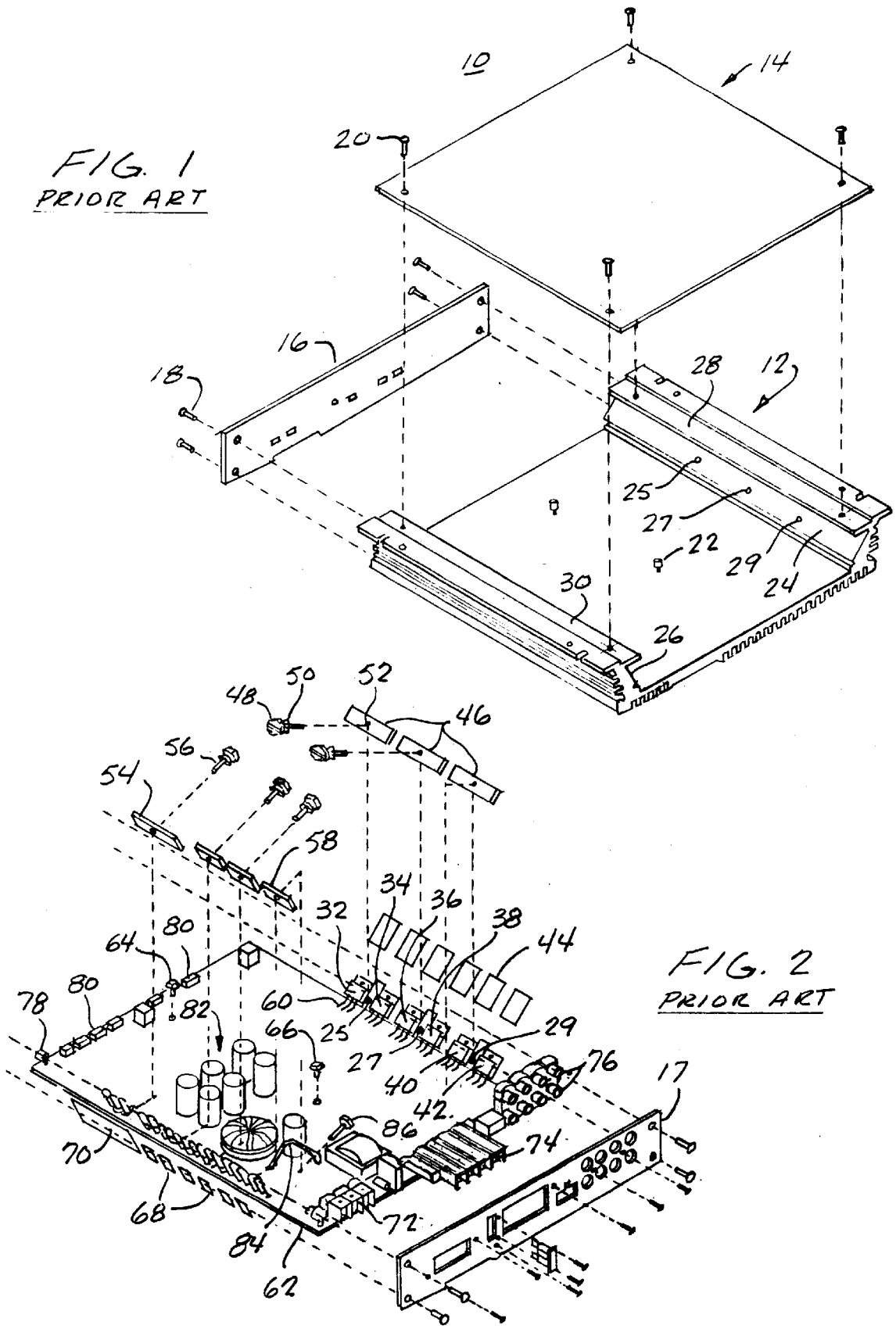
FIG. 1 is an exploded view of a heat sink structure of the prior art.
FIG. 2 is an exploded view of the printed circuit board and its components that are mounted on the heat sink structure of FIG. 1.

FIG. 1 is an exploded view of a prior art heat sink 10 illustrating the heat sink body portion 12, a bottom plate 14, and a front panel 16. Screws 18 hold the front panel 16 attached to the heat sink body portion 12. Screws 20 hold the bottom plate 14 to the heat sink body portion 12. A printed circuit board 62, shown in FIG. 2, is mounted in the inside of the heat sink body portion 12 on spacers 22. The heat-generating electronic devices such as integrated circuits are to be mounted on mounting surfaces 24 and 26 of the heat sink. Screw holes 25, 27, and 29 are drilled in the heat sink so that clamps can be attached over the electronic circuit-generating devices to hold them in heat transfer relationship to the heat-conducting surface 24. Ledges 28 and 30 receive the bottom cover 14.

FIG. 2 illustrates the printed circuit board 62, the other end panel 19, and the components that are to be mounted to and placed in the heat sink 12 as shown in FIG. 1.

As can be seen in FIG. 2, heat-generating electronic circuits 32, 34, 36, 38, 40, and 42 are mounted on heat-conducting surface 24 shown in FIG. 1. Silicone pads 44 are placed over the heat-generating devices 32–42 and aluminum bars or brackets 46 are placed over pairs of the heat-generating devices and held in place with screws 48 and washers 50 that pass through screw hole 52 in the aluminum bars and are attached to screw holes 25, 27, and 29 in the heat-conducting device mounting surface 24 shown in FIG. 1. In like manner, aluminum bars 54 and 58 with their associated screws 56 may be used to clamp other heat-generating circuits, not shown, on mounting surface 26 of the heat sink body portion 12 shown in FIG. 1. The leads 60 from the electronic heat-generating devices are attached to the printed circuit board 62 in a well-known manner. Screws 64 and 66 extend through the printed circuit board 62 into the spacers 22 shown in FIG. 1 of the heat sink body portion 12 to hold the printed circuit board 62 rigidly attached thereto. Silicone pads 68 and 70 are schematically shown and would be placed over the heat-generating devices (not shown) on the surface 26 in FIG. 1.

At the rear of the printed circuit board 62 are terminal connections 72 and 74 and electrical jacks 76 for connections through the rear panel 19 as well known in the art. The other end of the printed circuit board has an LED 78 and control elements 80. Other circuit elements 82 such as capacitors, coils, and transformers are old and well known in the art. A grounding wire 84 may be coupled to a ground terminal by a screw 86. Thus, holes 25, 27, and 29 must be drilled in each of the surfaces 24 and 26. Clamp bars 52, 54, and 58 must be attached over the heat-generating circuits 32, 34, 36, 38, 40, and 42 in pairs by placing screws 48 and 56 in holes 25, 27, and 29 to hold the heat-generating circuits 32–42 to the heat sink surfaces 24 and 26. Further, proper torquing of the screws must occur and metal burrs around the screw holes must be avoided.

Figure 3:
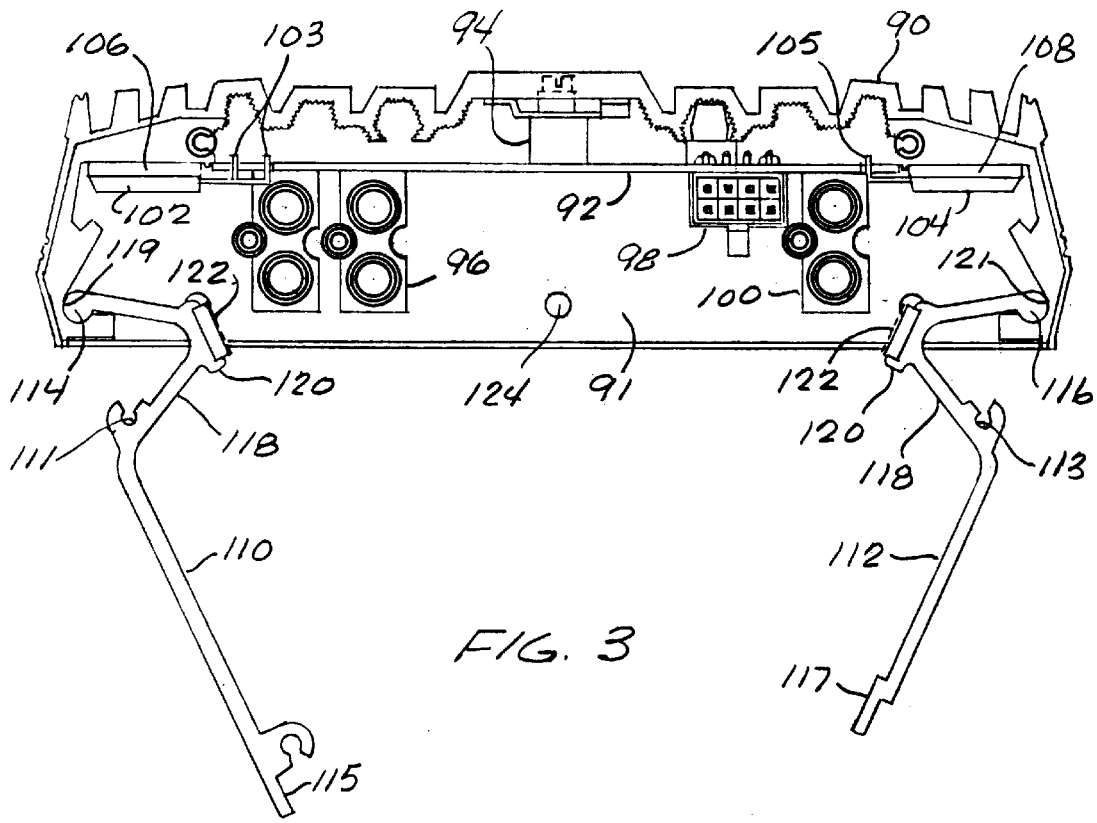
FIG. 3 is a cross-sectional end view of the novel heat sink of the present invention with the bottom covers in the open position.
Figure 4:
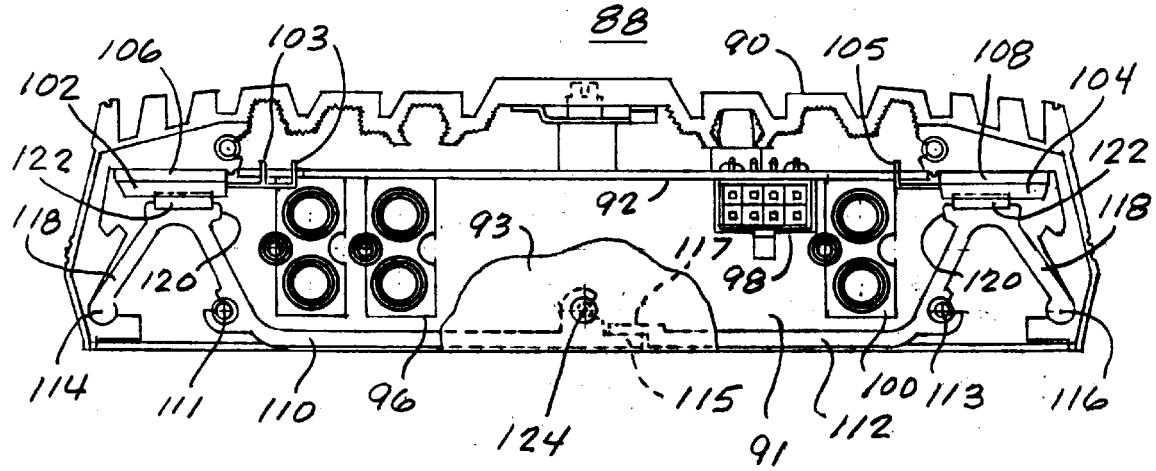
FIG. 4 is a cross-sectional view of the novel heat sink of the present invention with the bottom covers in the closed position applying pressure to the heat-generating electronic devices.

FIG. 3 is a cross-sectional view of the novel heat sink 88 of the preferred embodiment of the present invention. Heat sink body portion 90 has attached therein a printed circuit board 92 mounted on spacer 94 that is attached to the heat sink body portion 90 by means of a screw, not shown. The printed circuit board 92 has various electronic circuits 96, 98, and 100 mounted therein. Heat-generating electronic devices 102 and 104, such as integrated circuits or power transistors, are mounted on corresponding heat sink surfaces 106 and 108 to transfer heat generated to the heat sink body portion 90 through the mounting surfaces 106 and 108. Thus, surfaces 106 and 108 provide at least one surface on the heat sink body portion 90 for receiving multiple heat-generating electronic circuit packages 102 and 104 in heat transfer relationship. At least one bottom cover panel 110 is pivotally attached at a fulcrum 114 to the heat sink body portion 90 for movement between closed and open positions. Cover 110 is shown in the open position in FIG. 3. If desired, a second cover 112 can be pivotally attached to the heat sink body portion 90 at a fulcrum 116 also for movement between a closed and open position, the open position being shown in FIG. 3. Each of the bottom covers 110 and 112 has a protrusion 118 thereon with an apex 120 which, if machined properly for the right tolerance, can be used as an electronic circuit package engaging surface for engaging the integrated circuits 102 and 104 when the panels are in the closed position as shown in FIG. 4 to force the multiple heat-generating circuit packages against the heat sink surfaces 106 and 108 in heat transfer relationship. This action occurs only when the panels 110 and 112 are in the closed position as shown in FIG. 4.

Inasmuch as strict tolerances or would be required in such case, and inasmuch as the integrated circuit packages or power transistors 102 and 104 may be of different heights, a resilient material 122 may be placed on the apex 120 of each protrusion 118 for engaging the multiple electronic circuit packages and forcing them in heat transfer relationship against the surfaces 106 and 108 of the heat sink 90. The resilient material is one of several well-known materials used in the art and must be capable of deforming to allow for electronic circuit package thickness variations and to force all of the electronic circuit packages 102 and 104 against the corresponding heat sink surfaces 106 and 108 when the panels 110 and 112 are in the closed position. Each of the heat-generating electronic circuit packages 102 and 104 have electrical leads 103 and 105, respectively, that are electrically connected to the printed circuit board 192.

If desired, the resilient material may be of a heat conductive material and may have other contact surfaces thereon such as silicone pads and the like.

As can be seen in FIG. 4, when each of the bottom panels 110 and 112 are moved from the open position to the closed position as shown, the panels 110 and 112 pivot about fulcrums 114 and 116 and allow the resilient material 122 or fulcrum apex 120 to engage the heat-generating circuit packages 102 and 104 to hold them in heat transfer relationship with their respective surfaces 106 and 108 of the heat sink 90. The resilient material 122 may be a foam material and also may be heat conductive.

Thus, bottom covers 110 and 112 may have a circuit package engaging surface that is a protrusion 120 having a predetermined height above the covers 110 and 112 in superimposed relationship with and engaging the multiple heat-generating electronic circuit packages 102 and 104 only when the panels 110 and 112 are in the closed position. The protrusions 120 have a height above the bottom cover surfaces 110 and 112 sufficient to hold the multiple heat-generating electronic circuit packages 102 and 104 in contact with their corresponding surfaces 106 and 108 on the heat sink body portion 90 in the heat transfer relationship without damaging the heat-generating electronic circuit packages 102 and 104. In the embodiment shown in FIGS. 3 and 4, the panels 110 and 112 are hingedly attached to the heat sink body portion 90 for movement between an open and a closed position.

It is to be understood, of course, that only a single panel could be used to close the bottom of the heat sink 88 and have the corresponding necessary protrusions 118 with their apices 120 for engaging the heat-generating circuit packages 102 and 104. However, as will be understood, in the preferred embodiment, with the protrusions 118 located closest to the fulcrums 114 and 116, when the covers are closed, as shown in FIG. 4, the greatest lever arm pressure will be applied to the resilient material 122 at the apex of each of the protrusions 118, thus applying the greatest pressure to the heat-generating integrated circuit packages 102 and 104.

The panels 110 and 112 may be extruded of aluminum having the pivot fulcrums 114 and 116 formed as an elongated, at least partially cylindrical, surface and the panels 110 and 112 having an outer edge 115 and 117, respectively. Extruded concave slots 119 and 121 on the heat sink body portion 90 receive the pivot fulcrums 114 and 116 of the panels 110 and 112 in a pivoting relationship. Thus, the heat sink body portion 90 is a housing having four walls including the end walls 91 and 93 as shown in FIG. 4, a closed top portion 90, and the open bottom portion shown in FIG. 3. At least one printed circuit 92 is within the housing and at least the closed top 90 of the housing forms the heat sink. Electrical conductors 103 and 105 connect the multiple heat-generating electronic circuit packages 102 and 104 to the printed circuit board 92. At least one panel, but preferably two panels 110 and 112, covers the open bottom to enclose the housing when in the closed position as shown in FIG. 4. A fastening device 124 such as a screw or any other well-known fastening device may hold the two panels to the end panel 93 with their end portions 115 and 117 in overlapping relationship as shown in FIG. 4.

Figure 6:
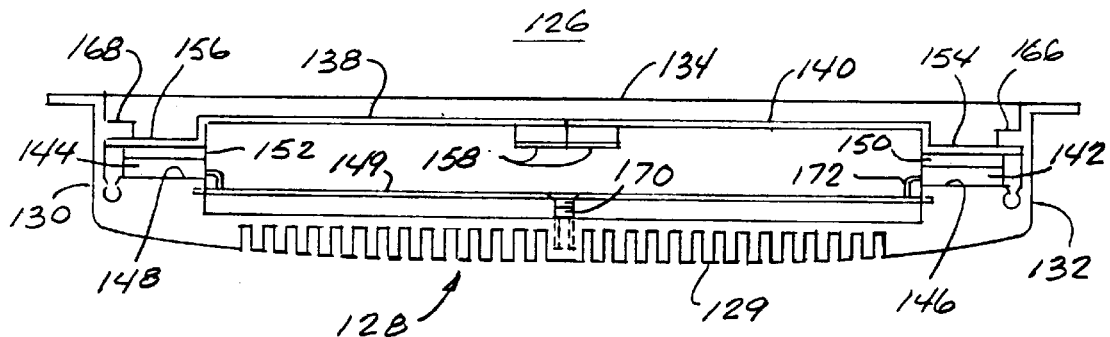
FIG. 6 is a cross-sectional view of the embodiment shown in FIG. 5 with the bottom panels assembled in a closed position to apply pressure to the heat-generating electronic devices and hold them in heat transfer relationship with the heat sink.
Figure 5:
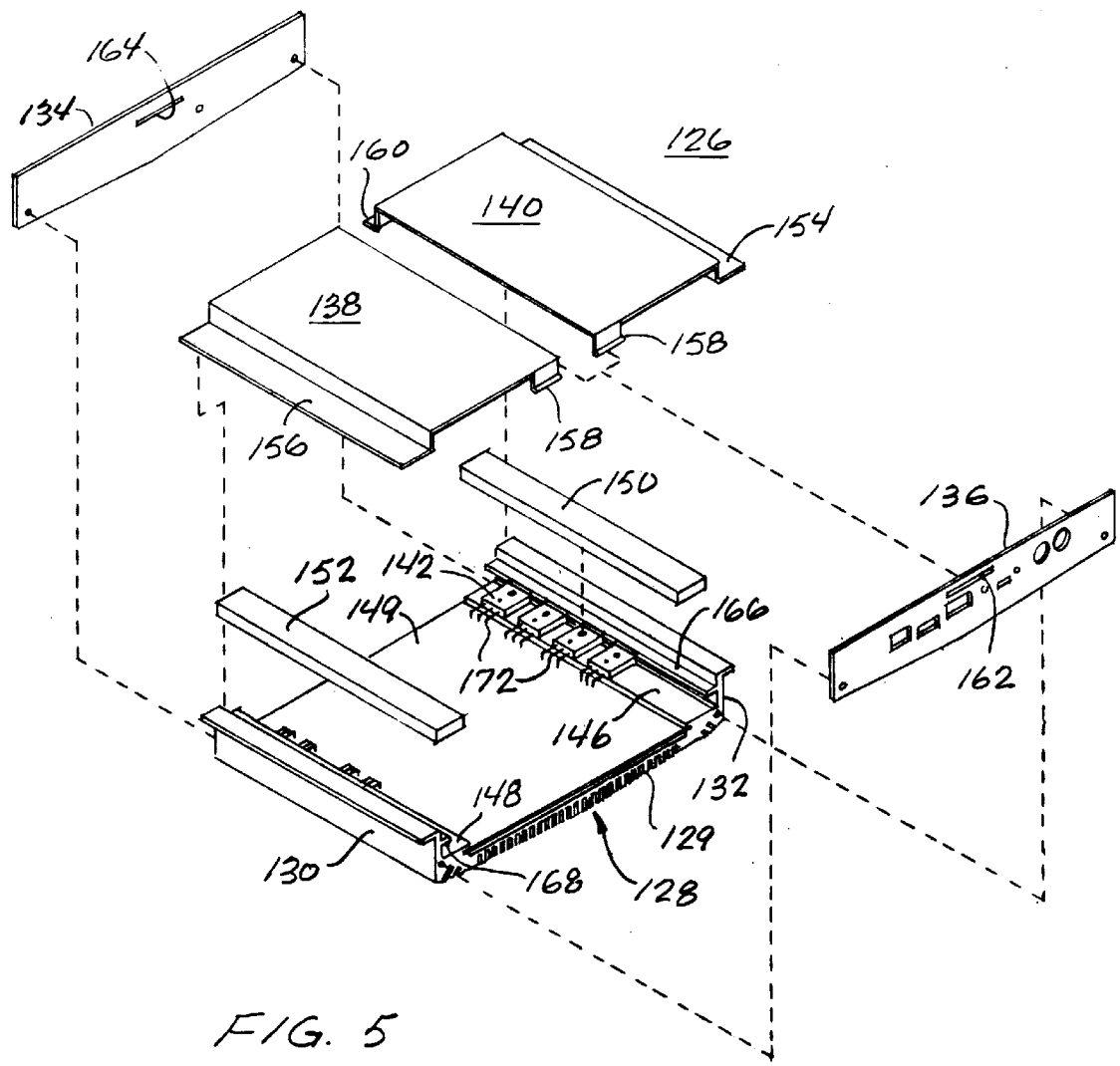
FIG. 5 is an exploded view of a second embodiment of the present invention utilizing stamped metal bottom covers.

FIGS. 5 and 6 illustrate a second embodiment of the invention wherein the bottom panels 138 and 140 are formed of stamped metal with an edge 154, 156 on the stamped metal panels 138 and 140 serving as a fulcrum. A lip 166 and 168 on each side of the heat sink holds the stamped metal panel fulcrums 154 and 156 in place when the stamped metal panels 138 and 140 are moved to the closed position.

As can be seen in the exploded view in FIG. 5, the device 126 (such as a car radio amplifier) comprises a heat sink body portion 128 having side walls 130 and 132. It also has a plurality of heat-dissipating fins 129 that are well known in the art. It has end panels 134 and 136 and bottom cover panels 138 and 140 that are formed of the stamped metal.

As can be seen in FIG. 5, a plurality of heat-generating electronic circuit packages 142 and 144 are placed on surfaces 146 and 148, respectively, of the heat sink 128 for transferring heat thereto. Strips of resilient material 150 and 152 are placed over the heat-generating packages 142 and 144. The edges 154 and 156 of the bottom covers 140 and 138, respectively, fit under the edges or lips 166 and 168 on the heat sink just above the heat-generating packages 142 and 144 to provide a fulcrum for the bottom covers 138 and 140. (See FIG. 6.)

Legs 158 and 160 on the bottom covers 138 and 140 serve as fasteners to engage slots 162 and 164 in the end panels 134 and 136 to hold the covers 138 and 140 in place once they have been pivoted about their fulcrums 154 and 156 against the resilient material 150 and 152. This can be more clearly seen in FIG. 6 where the heat sink 126 is shown with the panels 138 and 140 in the closed position. As can be seen therein, the flanges or fulcrums 154 and 156 are caught by lips 166 and 168 and, when the covers are pivoted about lips 166 and 168, they force the resilient material 150 and 152 against the heat-generating packages 142 and 144 to hold them firmly against the heat sink surfaces 146 and 148. The printed circuit board 149 may be held in place in the heat sink body portion 128 by means of a screw 170 as shown.

Thus, again, the novel device of FIG. 5 includes a heat sink housing having side walls 130 and 132 and end walls 134 and 136. It has a closed top portion where the fins 129 are placed and an open bottom portion. At least one printed circuit 149 is placed within the housing. At least the closed top portion 128, with the heat flanges 129, serve as the heat sink. Electrical conductors 172 connect the multiple heat-generating electronic circuit packages 142 and 144 to the printed circuit on board 149.

Thus, as can be seen in both embodiments shown in FIGS. 3 and 4 and FIGS. 5 and 6, there are spaced surfaces on the heat sink body portion for receiving multiple heat-generating electronic circuit packages. There are also first and second panels pivotally attached to the housing for covering the housing open bottom when in the closed position. In addition, there is an electronic circuit package engaging portion associated with each of the first and second panels forcing corresponding ones of the multiple heat-generating packages against the spaced surfaces only when the first and second panels are in the closed position. Further, as can be seen in all of the FIGS. 3–6, the multiple heat-generating electronic circuit packages are positioned on the elongated surfaces closer to the fulcrum of the panels than to the outer edge of the panels for providing maximum pressure on the electronic circuit packages when the panels are in their closed position.

Thus, there has been disclosed a novel clamping mechanism for holding output devices that generate heat such as power transistors (BJT MOSFET or BTL type integrated amplifier IC's) and power supply MOSFETs in heat transfer relationship with the heat sink without the use of any transistor hold-down clamps or the associated hardware. The heat sink does not require any secondary operations. Not one hole needs to be drilled for electromechanical functionality. No clamps, clamp fabrication, parts required for the production of the clamps, screws to hold down the clamps, holes to be drilled in the heat sink as secondary operations, or screws or clamps to be installed in production and properly torqued, are required with the present invention.

With respect to an electronic device such as an automobile radio amplifier, many parts and a great deal of labor is removed with this present design and thus costs are reduced and a more cost-efficient design can be manufactured.

The corresponding structures, materials, acts, and equivalents of all means or step plus function elements in the claims below are intended to include any structure, material, or act for performing the function in combination with other claimed elements as specifically claimed.

I claim:

1. A heat sink for an electronic device that includes heat generating electronic circuit packages and comprising:

a heat sink housing for dissipating heat;

said heat sink housing having four sidewalls, a closed top, and an open bottom;

at least one elongated heat sink surface within the four walls of said heat sink housing for receiving said heat-generating electronic circuit packages in heat transfer relationship;

at least one electronic printed circuit board within the four sidewalls of said heat sink housing electrically coupled to said heat-generating electronic circuit packages;

a bottom cover hingedly coupled to one of the four sidewalls for closing said open bottom of said heat sink housing;

said bottom cover being moveable between an open position to provide access to said electronic circuit within the four walls of said heat sink housing and a closed position enclosing said electronic circuit within said four sidewalls of said heat sink housing; and projections on said bottom cover for engaging and forcing the heat-generating electronic circuit packages against said at least one surface in heat transfer relationship only when said bottom cover is in said closed position.

2. The heat sink of claim 1 further comprising:

said heat-generating electronic circuit packages being of varying thickness; and a resilient material forming said projections on said bottom cover and being capable of deforming to allow for thickness variation of said heat-generating electronic circuit packages and to force all of the heat-generating electronic circuit packages of varying thickness against the elongated heat sink surface only when the bottom cover is in said closed position.

3. The heat sink of claim 2 wherein the resilient material is a heat conductive material.

4. The heat sink of claim 2 wherein the resilient material is a foam spring pad.

5. The heat sink of claim 1 wherein said bottom cover is hingedly attached to the heat sink housing for movement between its open and its closed position.

6. The heat sink of claim 5 further comprising:

said bottom cover being formed of extruded aluminum having an inner edge with a pivot fulcrum formed thereon as an elongated, at least partially cylindrical surface; and an extruded concave slot on the heat sink housing for receiving the pivot fulcrum of the bottom cover in a pivoting relationship.

7. The heat sink of claim 5 further comprising:

a stamped metal panel forming said bottom cover;

an edge on the stamped metal panel serving as a fulcrum; and a lip on the heat sink housing for holding the stamped metal panel fulcrum in place when the stamped metal panel is moved to the closed position.

8. The heat sink of claim 1 further comprising:

spaced surfaces on the heat sink housing within the four sidewalls for receiving the heat-generating electronic circuit packages;

first and second panels forming said bottom cover and hingedly coupled to opposing sidewalls of the housing open bottom at a fulcrum such that when pivoted toward each other to form the closed position, said first and second panels close said housing open bottom;

an inner edge forming said fulcrum and an outer edge on each of said first and second panels; and the electronic circuit package engaging projections being associated with each of the first and second panels for forcing corresponding ones of the heat-generating electronic circuit packages against the spaced surfaces only when the first and second panels are in the closed position.

9. The heat sink of claim 8 wherein the heat-generating electronic circuit packages are positioned on the elongated surfaces closer to the fulcrums of the first and second panels than to their outer edges for providing maximum pressure on the heat-generating electronic circuit packages when the first and second panels are in the closed position.

10. The heat sink of claim 1 wherein the heat-generating electronic circuit package engaging projections comprise:

at least one protrusion on said bottom cover in superimposed relationship with and engaging the heat-generating electronic circuit packages only when the bottom cover is in the closed position; and the protrusions having a height sufficient to hold the heat-generating electronic circuit packages in contact with the elongated surface on the heat sink housing in heat transfer relationship without damaging the heat-generating electronic circuit packages.

* * * * *

UNITED STATES PATENT AND TRADEMARK OFFICE
CERTIFICATE OF CORRECTION

PATENT NO. : 5,930,116
DATED : July 27, 1999
INVENTOR(S) : Palmer

It is certified that error appears in the above-identified patent and that said Letters Patent is hereby corrected as shown below:

Col. 8, line 9, after "extruded" and before "concave", insert --elongated--.

Signed and Sealed this

Eighth Day of August, 2000

Attest:

Q. TODD DICKINSON

Attesting Officer

Director of Patents and Trademarks